US008881935B2

(12) United States Patent
Trescher et al.

(10) Patent No.: US 8,881,935 B2
(45) Date of Patent: Nov. 11, 2014

(54) METAL HOUSING PART AND METHOD FOR MAUFACTURING THE HOUSING PART

(75) Inventors: Ulrich Trescher, Tuebingen (DE); Eckhard Schaefer, Tuebingen (DE)

(73) Assignee: Robert Bosch GmbH, Stuttgart (DE)

( * ) Notice: Subject to any disclaimer, the term of this patent is extended or adjusted under 35 U.S.C. 154(b) by 648 days.

(21) Appl. No.: 12/735,486

(22) PCT Filed: Dec. 29, 2008

(86) PCT No.: PCT/EP2008/068308
§ 371 (c)(1),
(2), (4) Date: Jul. 20, 2010

(87) PCT Pub. No.: WO2009/097941
PCT Pub. Date: Aug. 13, 2009

(65) Prior Publication Data
US 2010/0294787 A1 Nov. 25, 2010

(30) Foreign Application Priority Data

Feb. 4, 2008 (DE) .......................... 10 2008 007 346

(51) Int. Cl.
*H01R 43/02* (2006.01)
(52) U.S. Cl.
USPC ....................... 220/657; 174/50.56
(58) Field of Classification Search
CPC ..................................................... H01R 43/02
USPC ........ 220/657, 656, 3.2; 174/50.56, 152 GM, 174/554
See application file for complete search history.

(56) References Cited

U.S. PATENT DOCUMENTS

| 3,234,320 | A | * | 2/1966 | Wong .............................. 174/554 |
| 3,586,917 | A | * | 6/1971 | Oates ............................. 361/688 |
| 5,227,250 | A | | 7/1993 | Bobal et al. |
| 6,382,419 | B1 | * | 5/2002 | Fujimori et al. ............... 206/454 |
| 2002/0063134 | A1 | * | 5/2002 | von Holdt et al. ............. 220/657 |
| 2003/0068907 | A1 | | 4/2003 | Morte et al. |
| 2003/0209795 | A1 | | 11/2003 | Okada et al. |

FOREIGN PATENT DOCUMENTS

| DE | 26 47 63 | 1/1913 |
| DE | 20 61 179 | 6/1971 |
| DE | 90 10 159 | 10/1990 |
| DE | 196 40 466 | 4/1998 |
| GB | 918 543 | 2/1963 |
| JP | 2-110382 | 9/1990 |
| JP | 4-224145 | 8/1992 |
| JP | 4-335554 | * 11/1992 |

OTHER PUBLICATIONS

Translation of Abstract of JP 4-335554 dated Nov. 1992.*

* cited by examiner

*Primary Examiner* — Stephen Castellano
(74) *Attorney, Agent, or Firm* — Kenyon & Kenyon LLP

(57) ABSTRACT

A metal housing part having multiple through openings, a glass filling being situated in each of the openings, each glass filling closing an opening hermetically sealed and enveloping a contact end, which extends through the opening and the glass filling and whose two ends protrude out of the glass filling and the opening, and to a method for manufacturing the metal housing part. The housing part is configured as trough-shaped, having a base wall, side walls, and a flange. Because of the trough-shaped design, the housing part maintains its original shape even when the housing part is subjected to high temperatures.

11 Claims, 3 Drawing Sheets

METAL HOUSING PART AND METHOD FOR MAUFACTURING THE HOUSING PART

FIELD OF THE INVENTION

The present invention relates to a metal housing part having multiple through openings, a glass filling being situated in each of the openings, each glass filling closing one opening hermetically sealed and enveloping a contact pin, which extends through the opening and the glass filling and whose two ends protrude from the glass filling and the opening, and a method for manufacturing the metal housing part.

BACKGROUND INFORMATION

A housing part, which is referred to therein as a metal carrier part, having electronic components and/or circuit boards, in particular hybrid circuits, attached on the component side, whose terminals are led from the component side via multiple terminal pins embedded in glass feedthroughs up to the side of the carrier part opposite the component side, is discussed in German patent document DE 196 40 466 B4. The carrier part forms a housing base plate of a hermetically sealed housing. Housings of this type are usable, for example, in an automatic transmission of a motor vehicle, and an electronic controller contained therein selects gears and controls a clutch. When the terminal pins are embedded in glass, a part which receives the terminal pins is strongly heated. The part receiving the terminal pins may deform. The terminal pins are therefore situated on the at least one metal pin strip, which is provided with through holes, and which is manufactured from a high-quality alloy having a low coefficient of thermal expansion. Such alloys are referred to as Kovar or Invar. This pin strip is insertable into the carrier part, which is manufactured from a cost-effective stainless steel. The carrier part and the pin strip form a housing base, which is thus designed in multiple parts.

A method for manufacturing a monopolar or multipolar electrical feedthrough is discussed in German patent document DE 26 47 63 C3. A socket has a tubular side wall and a base. The floor has feedthrough holes, through which the feedthrough wires are guided. The socket is inserted into a housing from the inside and welded thereto.

SUMMARY OF THE INVENTION

The exemplary embodiments and/or exemplary methods of the present invention are based on the object of providing a simple housing part and a simple method for manufacturing the housing part.

This object may be achieved by the features described herein. According to the exemplary embodiments and/or exemplary methods of the present invention, the housing part is designed as trough-shaped, having a base wall, side walls, and a flange. Because of the trough-shaped design, the housing part maintains its original shape even if the housing part is subjected to high temperatures. The housing part is designed in one piece and may be manufactured from cost-effective steel, advantageously from cost-effective stainless steel.

In a simple manner, each two adjacent side walls form a right angle to one another. A torsionally rigid structure is thus achieved, which does not deform even at high temperatures.

The contact pins are advantageously situated in the flange. The contact pins, which are perpendicular to a base trough plane, are spaced apart therefrom. The contact pins protruding from the housing are protected in a channel of the housing.

The base wall of the housing part may be placed directly over a large area of a part of the automatic transmission for better heat dissipation.

In a simple manner, the flange has a peripheral groove. An edge of a housing cover may be inserted into the groove and the housing cover may be welded to the housing part.

In a simple manner, the flange has at least one further through opening. The opening is used to fasten the housing part or the housing inside the automatic transmission.

In a simple manner, at least one tab having a through opening is situated on the flange. According to a further specific embodiment, tabs are formed on the flange, which take into account a design of the automatic transmission, so that the housing part is attachable to the automatic transmission.

The tab advantageously has at least one tab part having a through opening, which is in the same plane as the base wall. After being fastened inside the automatic transmission, both the tab part and also the base wall rest on a planar automatic transmission part. The housing is retained in a stable, rigid, and heat-dissipating manner on the automatic transmission part.

The flange is advantageously designed as stepped, having two steps. The first step has the through contact pin openings and the contact pins. The second step is used to fasten the housing cover, which may be designed as a plate.

In a simple manner, the contact pins are manufactured from stainless steel. They are thus oxidation-free. A nickel-iron compound is suitable. Thin wires are well attachable to these stainless steel contact pins for connection to terminals of a hybrid circuit. Attachment of the terminal wires is also referred to as bonding.

A method for manufacturing a trough-shaped metal housing part, which is designed having a base wall, side walls, and a flange, has the following method steps: The metal housing part is deep-drawn and contact pins are embedded in glass in openings of the metal housing part. The contact pins are advantageously embedded in glass in openings which are situated in the flange.

The coefficient of thermal expansion of steel is advantageously greater than the coefficient of thermal expansion of glass, so that compression glass embedding occurs upon cooling; in other words the glass envelops the steel under pressure.

The following exemplary embodiments are explained in greater detail on the basis of the drawing for better understanding of the present invention.

DETAILED DESCRIPTION

Figure 1A:
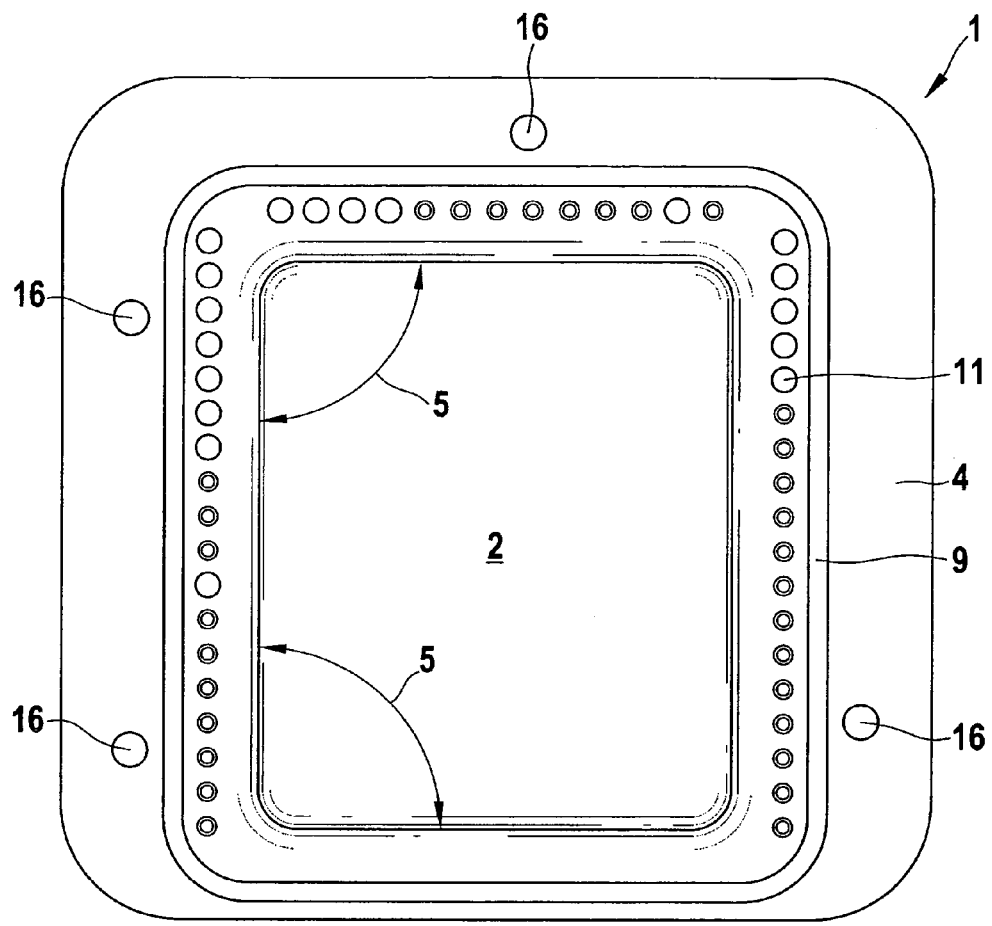
FIG. 1A shows a trough-shaped housing part having a flange in a top view.

Similar or identical elements are labeled using identical reference numerals in the various figures.

Figure 1B:
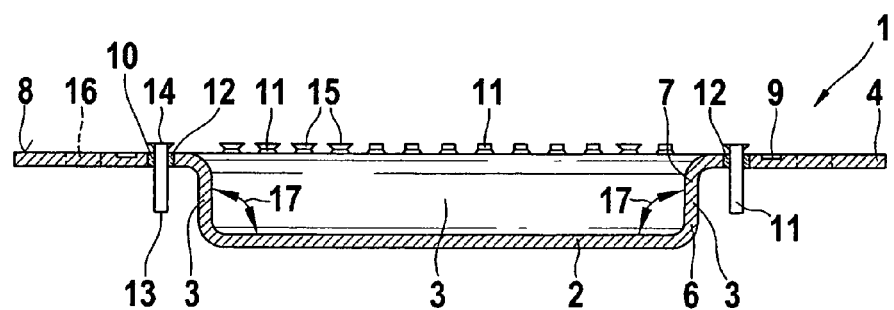
FIG. 1B shows the trough-shaped housing part having the flange in a lateral sectional illustration.

FIGS. 1A and 1B show a trough-shaped housing part 1 having a base wall 2, four side walls 3, and a flange 4. Base wall 2 is rectangular in shape and each two adjacent side walls 3 form a right angle 5 to one another. Housing base 2 and flange 4 are situated in parallel planes and at opposing ends 6, 7 of side walls 3. Base wall 2, side walls 3, and flange 4 are deep-drawn from a workpiece and are therefore designed in one piece. Flange 4 has a peripheral groove 9 on one front face 8, into which a housing cover may be inserted and welded to trough-shaped housing part 1. Openings 10, which pass through flange 4, are situated between groove 9 and side walls 3, in which contact pins 11 are insertable. Contact pins 11 are enveloped by a glass filling 12 and extend through flange 4 of the housing part and have ends 13, 14 protruding freely out of glass filling 12 and out of flange 4. Contact pins 11 are mounted freely in openings 10 during the manufacturing. A glass tablet, also referred to as a glass bead, is placed in each intermediate space between housing part 1 and contact pins 11. Housing part 1, contact pins 11, and the glass beads are heated, and each glass bead is thus melted or sintered to form a glass filling 12, in such a way that each contact pin 11 is mounted enveloped by glass filling 12 in housing part 1 electrically insulated with respect to housing part 1. A hermetic seal between each glass filling 12 and each contact pin 11 and each glass filling 12 and housing part 1 is achieved using the melting procedure. The melting procedure is also referred to as embedding in glass. Contact pins 11 are perpendicular to a base trough plane and are spaced apart therefrom. Contact pins 11 having enlarged heads 15 are used for the purpose of attaching two terminal wires to heads 15, in order to transport a larger quantity of current or to reach two different points of an electrical circuit. The attachment of the terminal wires is also referred to as bonding of bond wires. Two through openings 16 of flange 4 are used to fasten the housing made of housing part 1 and housing cover inside an automatic transmission of a motor vehicle. The housing cover is also referred to as the housing lid. Metal housing part 1 is deep-drawn in order to obtain the trough shape. Side walls 3 and base wall 2 form an angle 17 slightly greater than 90° to one another. Angle 17 is between 90° and 94°.

Figure 2A:
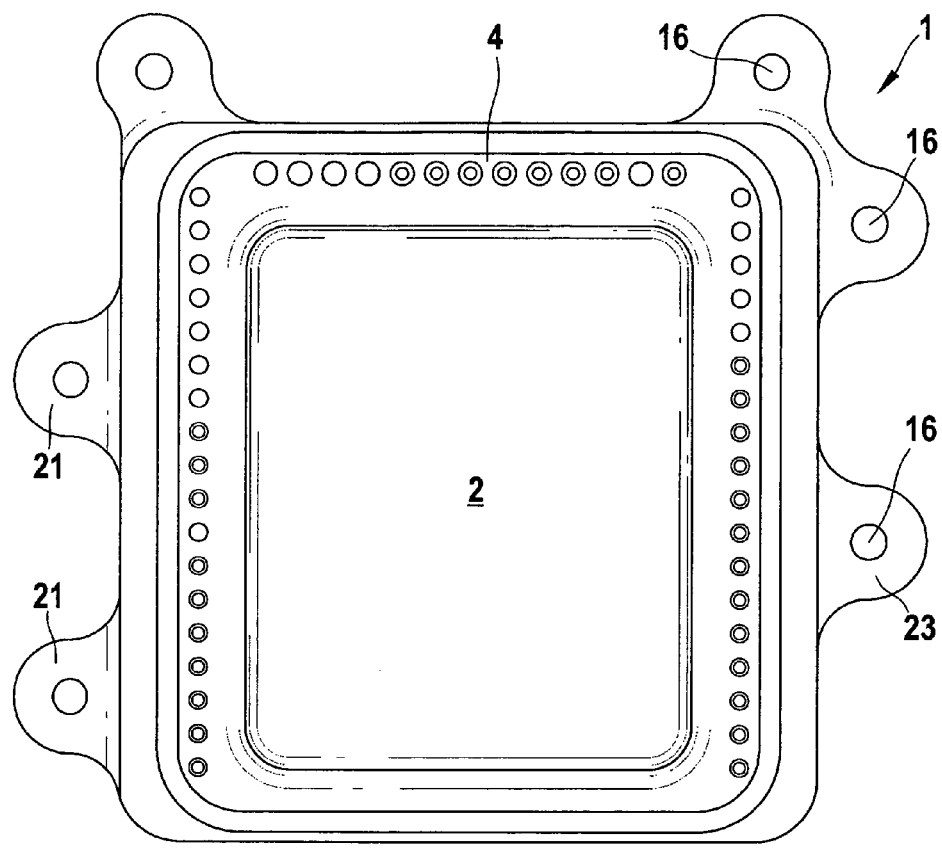
FIG. 2A shows a second trough-shaped housing part having a flange and having tabs in a top view.
Figure 2B:
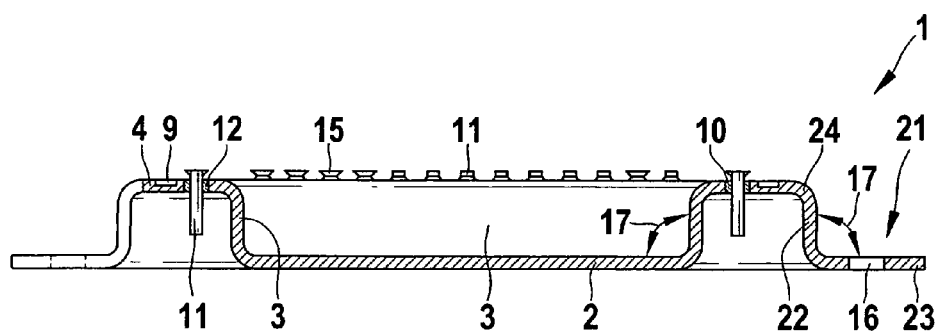
FIG. 2B shows the second trough-shaped housing part having the flange and the tabs in a lateral sectional illustration.

FIGS. 2A and 2B show a second trough-shaped housing part 1 having a base wall 2, four side walls 3, a flange 4, and five tabs 21. Base wall 2, side walls 3, flange 4, and five tabs 21 are deep-drawn from a workpiece and are therefore designed in one piece. Tabs 21, which are designed in one piece with housing part 1, are attached on flange 4. Each tab 21 has at least one through opening 16 for fastening the housing made of housing part 1 and housing lid inside the automatic transmission. Tab 21 has two tab parts 22 and 23, which form an angle 17, which is slightly greater than 90°, to one another. A first tab part 22 is placed using a curved part 24 on flange 4 so that second tab part 23 lies in the same plane as base wall 2. After being fastened inside the automatic transmission, both tab part 23 and also base wall 2 rest on a planar automatic transmission part and are thus retained securely and in a cooling manner.

Figure 3:
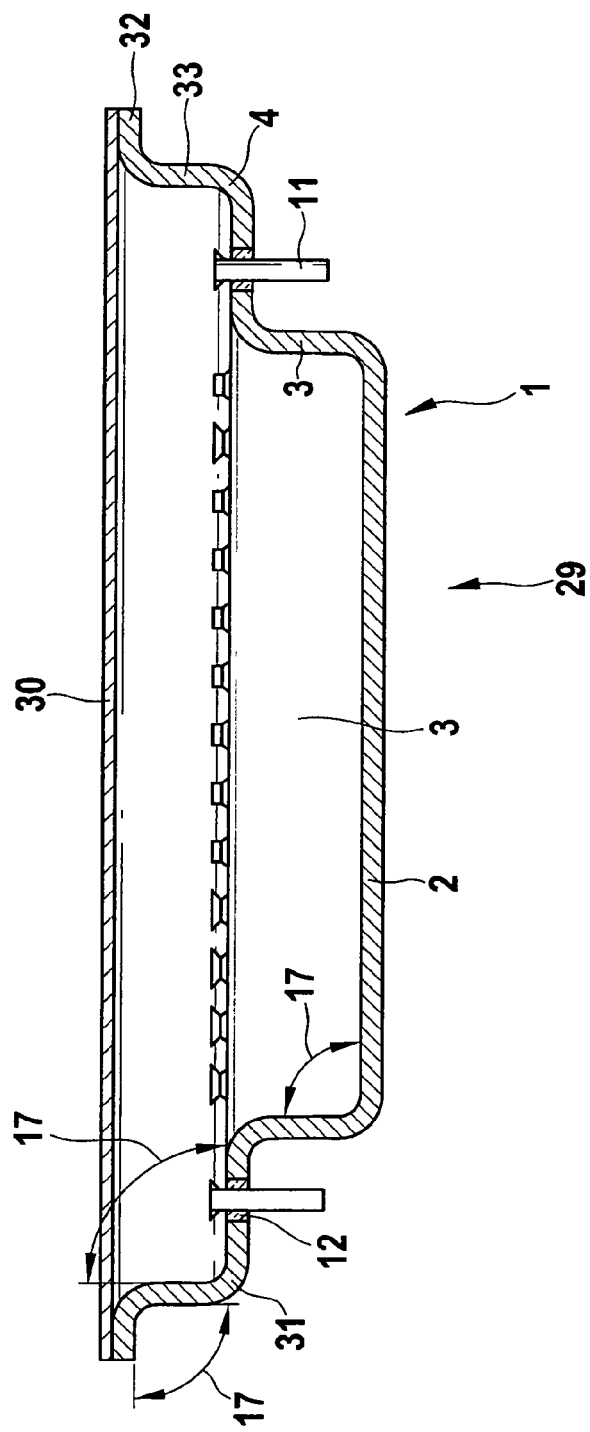
FIG. 3 shows a third trough-shaped housing part having a stepped flange in a lateral sectional illustration.

FIG. 3 shows a hermetically sealed housing 29 having a third trough-shaped housing part 1 and a housing cover 30. Third trough-shaped housing part 1 has a base wall 2, four side walls 3, and a stepped flange 4. Stepped flange 4 has two steps 31 and 32 and an intermediate part 33. Base wall 2 and steps 31 and 32 are in parallel planes. Side wall 3 and intermediate part 33 of each side of housing part 1 are in parallel planes. Intermediate part 33 and steps 31 form an angle 17, which is slightly greater than 90°, to one another. First step 31 has through contact pin openings 10. Contact pins 11 are situated in first step 31. Second step 33 is used for fastening second housing cover 30, which is designed as a plate.

What is claimed is:

1. A metal housing part, comprising:
   contact pins; and
   a metal housing arrangement having multiple through openings, the openings passing through a flange of the metal housing arrangement, wherein a glass filling is situated in each of the openings, each glass filling closing an opening, hermetically sealing it and enveloping a contact pin, which extends through the opening, the glass filling, and the flange, and whose two ends protrude out of the glass filling and the opening;
   wherein the metal housing arrangement is configured as trough-shaped and includes:
   a base wall;
   side walls that extend upward at a periphery of the base wall, and at least a portion of which extend above a top of the base wall; and
   the flange, the flange being exterior to the side walls and extending beyond, and in a plane higher than a top of, a periphery of the at least the portion of the side walls, and away from, the side walls.

2. The housing part of claim 1, wherein each of two adjacent ones of the side walls form a right angle to one another.

3. The housing part of claim 1, wherein the contact pins are in the flange.

4. The housing part of claim 1, wherein the flange has a peripheral groove.

5. The housing part of claim 1, wherein the flange has at least one second through opening.

6. The housing part of claim 1, wherein at least one tab having a through opening is situated on the flange.

7. The housing part of claim 6, wherein the tab has at least one tab part having a through opening, which is in a same plane as the base wall.

8. The housing part of claim 1, wherein an extension of the flange at the top portion of the sidewalls forms a first step, and the flange includes a second step.

9. The housing part of claim 8, wherein the flange includes two support parts situated in respective planes that are each perpendicular to planes in which the side walls are situated, and includes an intermediate part connecting the two support parts and situated in planes that are parallel to respective ones of the planes in which the side walls are situated.

10. The housing part of claim 9, wherein the base wall and each of the support parts are situated in parallel planes.

11. The housing part of claim 1, wherein the contact pins are of stainless steel.

* * * * *